US 6,740,221 B2

(12) United States Patent
Cheung et al.

(10) Patent No.: US 6,740,221 B2
(45) Date of Patent: May 25, 2004

(54) METHOD OF FORMING COPPER INTERCONNECTS

(75) Inventors: Robin Cheung, Cupertino, CA (US); Liang-Yuh Chen, Foster City, CA (US)

(73) Assignee: Applied Materials Inc., Santa Clara, CA (US)

( * ) Notice: Subject to any disclaimer, the term of this patent is extended or adjusted under 35 U.S.C. 154(b) by 292 days.

(21) Appl. No.: 09/810,677

(22) Filed: Mar. 15, 2001

(65) Prior Publication Data

US 2002/0130046 A1 Sep. 19, 2002

(51) Int. Cl.⁷ .................................................. C25D 5/18
(52) U.S. Cl. ....................... 205/104; 205/291; 205/292; 205/296; 205/239; 205/83; 205/84
(58) Field of Search ................................ 205/291, 292, 205/296, 239, 103, 104, 82, 83, 84

(56) References Cited

U.S. PATENT DOCUMENTS

| | | | |
|---|---|---|---|
| 3,522,155 A | 7/1970 | Dow | 204/43 |
| 4,187,166 A | 2/1980 | Kruper | 204/43 S |
| 4,356,067 A | 10/1982 | McCoy | 204/43 Z |
| 4,389,286 A | 6/1983 | McCoy | 204/44 |
| 4,396,467 A | 8/1983 | Anthony | |
| 4,466,864 A | 8/1984 | Bacon et al. | |
| 4,496,436 A | 1/1985 | Inoue | |
| 4,789,437 A | 12/1988 | Sing et al. | |
| 4,855,016 A | 8/1989 | Jucha et al. | 156/643 |
| 4,869,971 A | 9/1989 | Nee et al. | |
| 5,084,356 A | 1/1992 | Deak et al. | 428/458 |
| 5,141,602 A | 8/1992 | Chen et al. | |
| 5,302,256 A | 4/1994 | Miura et al. | 205/85 |
| 5,418,002 A | 5/1995 | Paik et al. | 427/96 |
| 5,493,132 A | 2/1996 | Brugge et al. | 257/101 |
| 5,580,668 A | 12/1996 | Kellam | 428/610 |
| 5,705,230 A | 1/1998 | Matanabe et al. | |

(List continued on next page.)

FOREIGN PATENT DOCUMENTS

| | | |
|---|---|---|
| EP | 0 048 579 | 3/1982 |
| EP | 1 091 023 A2 | 4/2001 |
| JP | 2000 174027 | 6/2000 |
| JP | 1 050 902 A2 | 11/2000 |
| JP | 2001 172791 | 6/2001 |
| WO | 98/27585 | 6/1998 |

OTHER PUBLICATIONS

International Search Report dated Dec. 9, 2002, for PCT/US02/07845.

*Primary Examiner*—Wesley A. Nicolas
(74) *Attorney, Agent, or Firm*—Moser, Patterson & Sheridan

(57) ABSTRACT

A method of forming a copper layer with increased electromigration resistance. A doped copper layer is formed by controlling the incorporation of a non-metallic dopant during copper electroplating.

35 Claims, 5 Drawing Sheets

U.S. PATENT DOCUMENTS

| | | | |
|---|---|---|---|
| 5,744,019 A | * 4/1998 | Ang | 205/96 |
| 5,833,920 A | 11/1998 | Nakanishi et al. | 420/477 |
| 5,882,425 A | 3/1999 | Graham | 134/1.3 |
| 5,882,498 A | 3/1999 | Dubin et al. | |
| 5,907,790 A | 5/1999 | Kellam | |
| 5,911,113 A | 6/1999 | Yao et al. | |
| 5,985,048 A | 11/1999 | Wahlert et al. | |
| 5,985,126 A | 11/1999 | Bleck et al. | |
| 6,063,506 A | 5/2000 | Andricacos et al. | |
| 6,066,892 A | 5/2000 | Ding et al. | |
| 6,077,571 A | 6/2000 | Kaloyeros et al. | |
| 6,099,712 A | 8/2000 | Ritzdorf et al. | |
| 6,110,817 A | 8/2000 | Tsai et al. | |
| 6,120,641 A | 9/2000 | Stevens et al. | |
| 6,130,156 A | 10/2000 | Havemann et al. | |
| 6,136,163 A | 10/2000 | Cheung et al. | |
| 6,143,126 A | 11/2000 | Stevens | |
| 6,171,960 B1 | 1/2001 | Lee | |
| 6,176,996 B1 | 1/2001 | Moon | |
| 6,183,619 B1 | 2/2001 | Gillman et al. | |
| 6,195,248 B1 | 2/2001 | Kunishi et al. | |
| 6,197,181 B1 | 3/2001 | Chen | |
| 6,242,349 B1 | 6/2001 | Nogami et al. | |
| 6,245,672 B1 | 6/2001 | Hong et al. | |
| 6,251,249 B1 | 6/2001 | Chevalier et al. | |
| 6,267,863 B1 | 7/2001 | Abys et al. | |
| 6,268,291 B1 | 7/2001 | Andricacos et al. | |
| 6,277,263 B1 | 8/2001 | Chen | |
| 6,290,833 B1 | 9/2001 | Chen | |
| 6,303,498 B1 | 10/2001 | Chen et al. | |
| 6,303,505 B1 | 10/2001 | Ngo et al. | |
| 6,319,387 B1 | 11/2001 | Krishnamoorthy et al. | |
| 6,331,490 B1 | 12/2001 | Stevens et al. | |
| 6,344,281 B1 | 2/2002 | Smith et al. | |
| 6,346,470 B1 | 2/2002 | Nogami et al. | |
| 6,358,388 B1 | 3/2002 | Bleck et al. | |
| 6,358,848 B1 | 3/2002 | Lopatin | |
| 6,368,475 B1 | 4/2002 | Hanson et al. | |
| 6,368,966 B1 | 4/2002 | Krishnamoorthy et al. | |
| 6,376,374 B1 | 4/2002 | Stevens | |
| 6,387,805 B2 | 5/2002 | Ding et al. | |
| 6,432,819 B1 | 8/2002 | Pavate et al. | |
| 6,491,806 B1 | * 12/2002 | Dubin et al. | 205/296 |
| 2001/0014408 A1 | 8/2001 | Mitsuhashi et al. | 428/606 |
| 2001/0050233 A1 | 12/2001 | Uzoh et al. | 205/96 |
| 2002/0050628 A1 | 5/2002 | Krishnamoorthy et al. | 257/586 |

* cited by examiner

Seed Layer: IMP Ta /IMP Cu 200
ECP Thicknes: 0.8μm
Wafer Size: 200mm

METHOD OF FORMING COPPER INTERCONNECTS

BACKGROUND OF THE DISCLOSURE

1. Field of the Invention

The invention relates to a method of forming copper interconnects.

2. Background of the Invention

Electromigration can lead to considerable material transport in metal films, and electromigration-induced failure is one the most important modes of failure in metal lines in Very Large Scale Integration (VLSI) circuits. The directional mobility of atoms are enhanced by the presence of grain boundaries, dislocation, and point defects in metal films. In the case of aluminum, electromigration leads to a transport and accumulation of aluminum in the direction of electron flow, resulting in discontinuities in the metal lines. Electromigration resistance in aluminum can be improved by the addition of copper, e.g., between about 0.5% to about 1%, to the aluminum films. It is believed that copper addition results in a change in the texture of aluminum films and an increase in the activation energy for aluminum self-diffusion, which in turn results in an improvement in electromigration resistance.

Copper has gained increasing popularity as a metal interconnect in advanced integrated circuit fabrication. Despite its significantly higher electromigration resistance compared to aluminum, there is an ongoing need to provide methods for improving electromigration resistance in copper interconnects.

SUMMARY OF THE INVENTION

The invention generally provides a method of forming a copper layer having improved electromigration characteristics. According to embodiments of the invention, a doped copper layer is formed by controlling an amount of a non-metal dopant incorporated in the doped copper layer. In one embodiment, the non-metal dopant is carbon, and the doped copper layer is formed by electroplating.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Embodiments of the invention generally provide a method of forming copper layers. According to one aspect of the invention, a non-metallic dopant is incorporated into a copper layer. In one embodiment, the non-metallic dopant is carbon. The amount of carbon incorporated into the copper layer can be controlled by varying the process parameters during copper electroplating. One source for the carbon dopant is an organic additive present in an electroplating bath.

Figure 1:
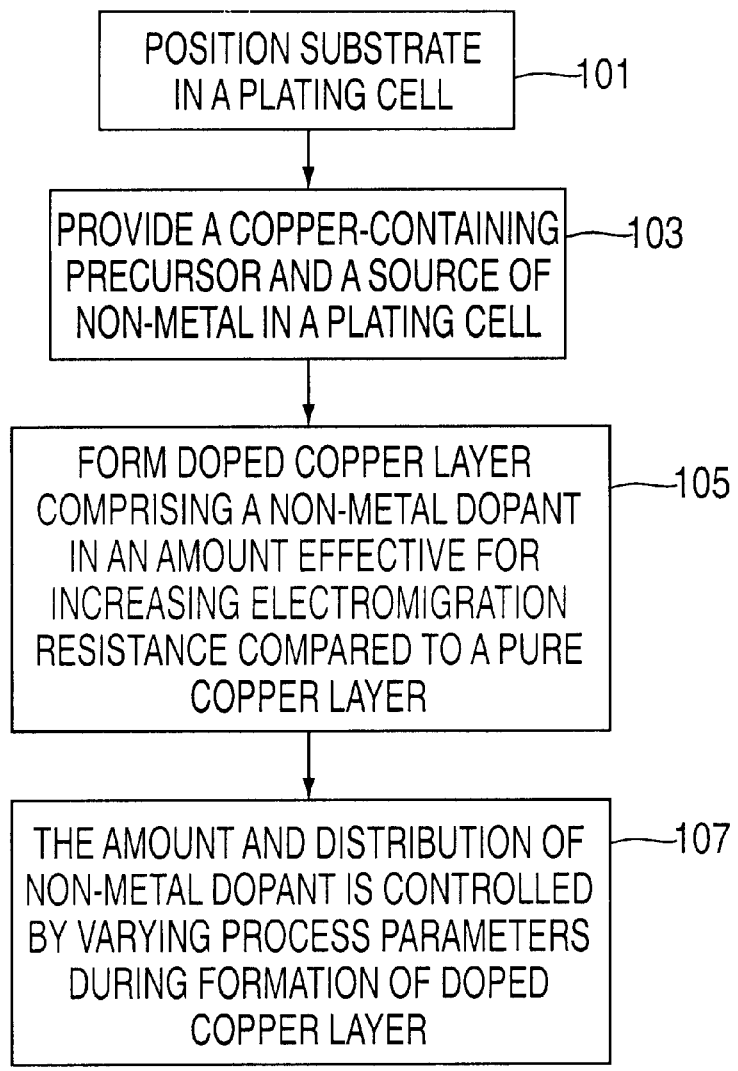
FIG. 1 is a process flow diagram incorporating method steps according to embodiments of the invention.

FIG. 1 is a process flow diagram illustrating method steps incorporating embodiments of the invention. In step 101, a substrate is positioned in a process chamber, e.g., an electroplating cell, for forming copper. In step 103, a copper-containing precursor and a source containing a non-metal are provided in the electroplating cell.

According to one aspect of the invention, a doped copper layer comprising the non-metal dopant is formed on the substrate, as shown in step 105. The non-metal is present in the copper layer in an amount that is effective for improving the electromigration characteristics of the copper layer, without causing other undesirable results or failure mechanisms. Thus, the doped copper layer containing the effective amount of non-metal has an increased electromigration resistance compared to a substantially pure copper layer. It is believed that the activation energy for copper diffusion, e.g., grain boundary diffusion, is increased when non-metallic dopant species are incorporated in copper grain boundaries. This increased diffusion activation energy results in an increase in electromigration resistance.

According to another aspect of the invention, the distribution of non-metal within the doped copper layer is controlled by varying process parameters during the formation of the doped copper layer, as shown in step 107.

In one embodiment, the non-metal in the doped copper layer is carbon. For example, the doped copper layer may be formed by electroplating, and the carbon is provided by an organic-based component in the electroplating bath. The amount and distribution of carbon within the doped copper layer is controlled by varying the electroplating pulse sequence, e.g., electrical current and time duration, during copper electroplating.

Apparatus

Embodiments of the invention maybe practiced using a variety of apparatus suitable for forming electroplated copper layers. One example of an electroplating apparatus is an ELECTRA™ ECP system, which is available either as a stand alone electroplating system or as part of an integrated processing system known as iECP™, both of which are available from Applied Materials, Inc., of Santa Clara, Calif. Details of an integrated processing system have been disclosed in commonly assigned U.S. Pat. No. 6,136,163, entitled "Apparatus for Electrochemical Deposition with Thermal Anneal Chamber", issued on Oct. 24, 2000, which is incorporated herein by reference in its entirety.

Figure 2:
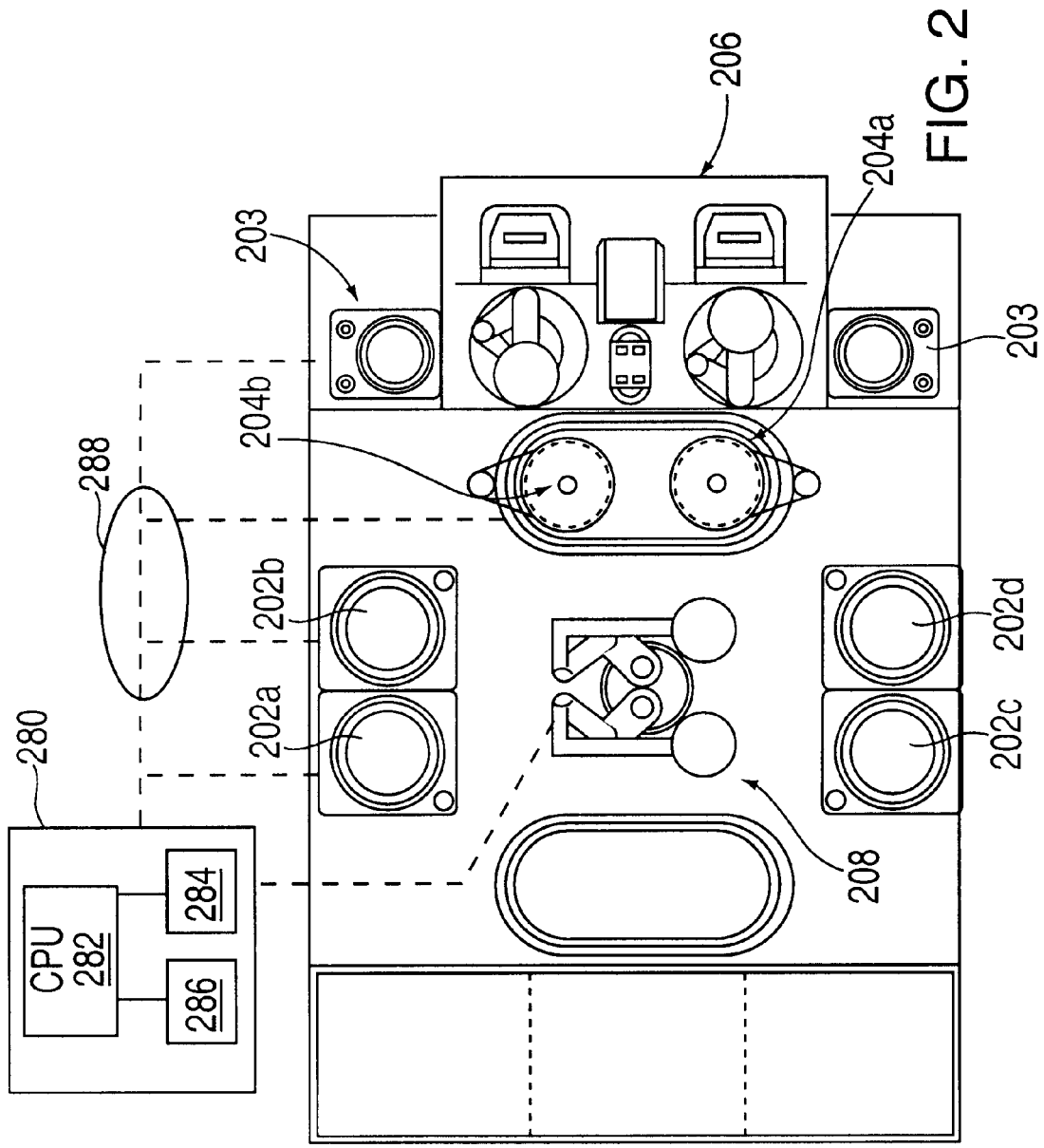
FIG. 2 is a schematic illustration of an apparatus suitable for copper electroplating.

FIG. 2 is a schematic representation of an integrated processing system 200 suitable for practicing copper electroplating according to embodiments of the invention.

The integrated processing system 200 comprises several process chambers such as metal deposition chambers 202a, 202b, 202c and 202d, cleaning stations 204a and 204b, two annealing chambers 203 and a loading station 206. A robot 208 is provided for wafer transfer and handling.

During integrated processing, a copper layer is formed on a substrate in one of the processing chambers 202a–d using electroplating or other deposition techniques. After suitable cleaning processes inside the cleaning station 204 or 206, the substrate having the deposited copper layer is transferred to the annealing chamber 102 by a transfer mechanism such as a robot. Thus, the integrated processing system allows in-situ annealing of the copper layer—i.e., annealing the deposited copper layer without removing the substrate from the integrated processing system 200. One advantage of such in-situ processing is that the time delay between the cleaning and annealing steps can be kept relatively short, e.g., about one to two minutes. Therefore, undesirable oxidation of the deposited copper layer can be minimized.

As illustrated in FIG. 2, a controller 280 is also used to control the operation of the integrated processing system 200. For example, the controller 280 comprises a general purpose computer or a central processing unit (CPU) 282, support circuitry 284, and storage medium or memories 286 containing associated control software. The controller 280 is responsible for automated control of the numerous steps required for wafer processing—such as wafer transport, chemical management, temperature control, and so on. Bi-directional communications between the controller 280 and the various components of the integrated system 200 are handled through numerous signal cables collectively referred to as signal buses 288, some of which are illustrated in FIG. 2.

In one embodiment, copper deposition is performed using electroplating in one of the process chambers 202a–d, e.g., an electrochemical deposition cell. A copper electroplating bath usually contains different chemical components such as a copper-containing electrolyte and additives. An electrical current or voltage passes through the electrolyte to result in copper deposition on a substrate.

Figure 3:
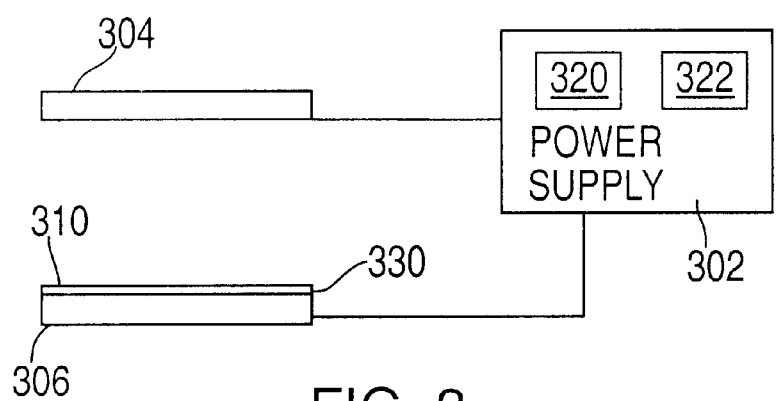
FIG. 3 is a schematic representation of electrical connections used for electroplating.

FIG. 3 is a schematic diagram showing the electrical connections used for electroplating. A power supply 302 is connected to two electrodes 304 (e.g., anode) and 306 (e.g., cathode) of an electroplating system. The cathode 306 electrically contacts a seed layer 310 on the plating surface 308 of the substrate 330. The power supply 302 preferably includes a control circuit 320 that switches between a constant current operation and a constant voltage operation, and further controls the polarity of the output. The power supply 302 preferably also includes a switching circuit 322 that is programmable to produce a variety of output waveforms. The film characteristics of deposited copper layers maybe varied by controlling the electroplating waveforms and process conditions of the electroplating bath.

Copper Electroplating

Figure 4A:
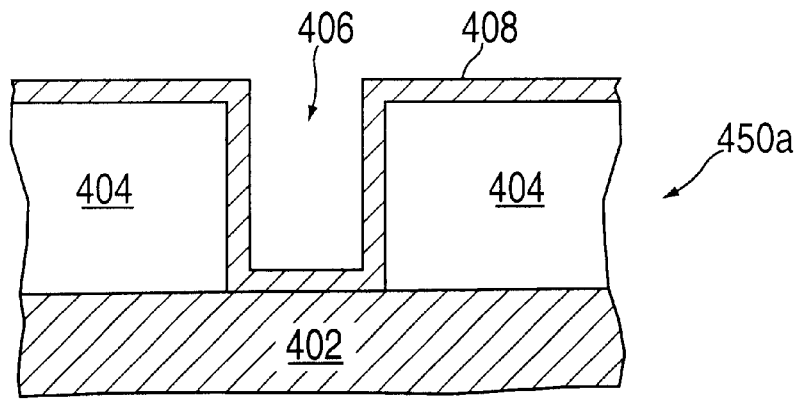
FIGS. 4a–c are schematic sectional views of a substrate during various stages of forming a metal interconnect.
Figure 4B:
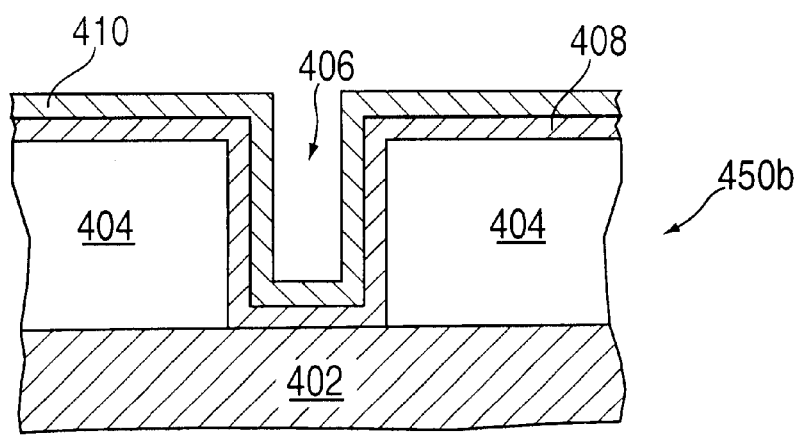
Figure 4C:
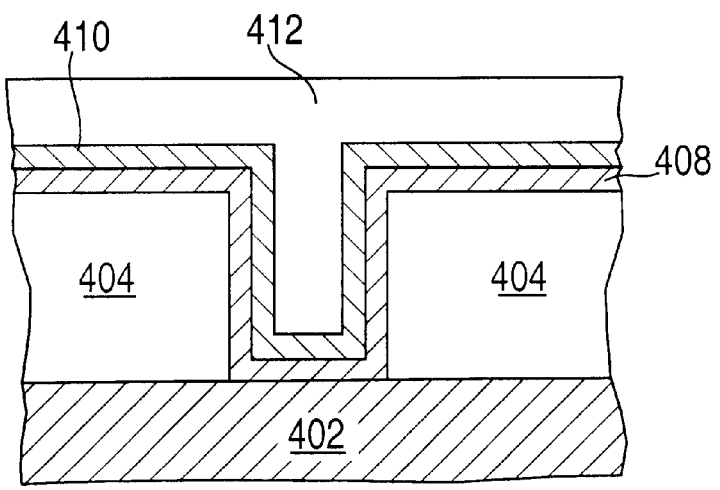

FIGS. 4a–c are sectional views of a substrate undergoing various stages of processing according to one embodiment of the invention.

FIG. 4a shows an example of a substrate structure 450a prior to copper deposition, comprising a patterned insulating layer 404 formed on an underlying layer 402. As used in this disclosure, the term "substrate structure" is used generally to denote any substrate that may include one or more material layers deposited thereon. Depending on the specific stage of device fabrication, the underlying layer 402 may comprise, for example, silicon, polysilicon, silicide, copper, tungsten or aluminum, among others. The insulating layer 404 maybe an oxide layer that has been patterned by conventional lithographic and etching techniques to form an opening 406 such as a contact, via or trench. For VLSI applications, the opening 406 typically has a relatively high aspect ratio (depth divided by width) of at least about 4:1. A barrier layer 408 comprising a conductive material (e.g., titanium, titanium nitride, tantalum, or tantalum nitride, among others) is formed over the insulating layer 404 and inside the opening 406 using conventional techniques such as physical vapor deposition (PVD), CVD or electroless deposition.

Prior to the formation of electroplated copper inside the opening 406, a relatively thin seed layer of metal 410, preferably copper, is formed over the barrier layer 408, as shown in FIG. 4b. The seed layer of metal 410, which is conductive, facilitates subsequent copper electroplating. In one example, the seed layer of metal 410 has a thickness of up to about 3000 Å, e.g., preferably about 1500 Å, and maybe deposited using PVD techniques such as ionized metal plasma (IMP) physical sputtering or self-ionized plasma (SIP). The seed layer of metal 410 may also be deposited to other thickness, or using other deposition techniques such as CVD or electroless processes.

The substrate structure 450b of FIG. 4b is then subjected to copper electroplating, resulting in the formation of a doped copper layer 412, which forms a metal interconnect inside the opening 406, as illustrated in FIG. 4c. To practice copper electroplating according to embodiments of the invention, the substrate structure 450b is connected to an electrode inside an electroplating cell, using electrical connections similar to those shown in FIG. 3. The doped copper layer 412 comprises an amount of a non-metallic dopant that is effective for increasing electromigration resistance of the doped copper layer 412 compared to that of pure copper or a copper layer formed by conventional techniques, without causing other undesirable results or failure mechanisms.

Embodiments of the invention maybe practiced using different copper electroplating baths. In general, aside from a copper-containing electrolyte, a copper electroplating bath also contains additives such as suppressors and accelerators which are used to control the deposition profile. For example, when suppressor molecules adsorb on the substrate surfaces, they inhibit or reduce copper deposition in those areas. On the other hand, accelerators compete with suppressor molecules for adsorption sites, and accelerate copper growth in areas where accelerators have been adsorbed.

To practice embodiments of the invention, the electroplating bath further comprises a source of a non-metallic dopant to be incorporated into the copper layer. Possible non-metallic dopants include carbon and chlorine, among others. The source of the non-metallic dopant maybe an additive that is usually present in the bath, or it maybe added to the bath specifically to provide the non-metallic dopant for incorporation into the deposited copper layer. For example, organic-based suppressors such as polyethylene glycol (PEG) type of compounds and ethylene oxide propylene oxide (EOPO) type surfactant, may act as a source for carbon. In those electroplating baths where chloride ions are needed to activate the suppressor, hydrochloric acid may serve the additional role of providing the chlorine dopant for the copper layer. However, if chlorine dopant is used, the chlorine concentration in the doped copper layer should be kept sufficiently low to avoid potential processing issues such as corrosion.

During electroplating, an electrical current is applied to the electrode according to a certain plating pulse sequence, e.g., deposition pulse current and duration, to achieve desired plating results. The plating pulse sequence to be employed depends on the specific electroplating bath that is used.

The amount of carbon incorporation and the distribution of carbon within the doped copper layer can be controlled by using an appropriate plating pulse sequence in conjunction with varying process parameters in the plating bath as well as post deposition treatment such as thermal annealing.

Several examples are given below to illustrate various applications according to embodiments of the invention.

EXAMPLE 1

In one embodiment, the electroplating bath comprises copper sulfate, with appropriate additives such as an accelerator, a suppressor and a chlorine-containing source for generating chloride ions. For example, copper sulfate may be present in a concentration range of between about 0.1M to about 0.9M, and the electroplating bath may have a pH ranging from about 0.6 to about 3. The activities of suppressers and accelerators depend on various parameters such as temperature, pH and chloride concentration in the electroplating bath. A stronger acid (i.e., lower pH) tends to shorten the lifetime of the additives. This electroplating bath, which has a pH that is higher than conventional baths, is referred to in this disclosure as Plating Bath A.

The additives comprise an accelerator X and a suppressor Y which are supplied by LeaRonal (now Shipley) of New York, U.S.A., as Electra plate X Rev 1.0 and Electra plate Y Rev 1.0 respectively. The accelerator X is a sulfonic acid based compound, and has a concentration range between about 5 and about 200 ppm. The suppressor Y is an ethylene oxide propylene oxide type of compound, and is present in a concentration range between about 5 ppm and about 400 ppm.

Chloride ions, which are used to activate the suppressor, are present at a concentration between about 50 and about 400 ppm, preferably between about 70 and about 100 ppm. The electroplating bath is maintained at a temperature around room temperature, e.g., between about 10° C. and about 25° C.

A detailed description of the electroplating chemistry, particularly the composition of the electrolyte and additives, is provided in commonly assigned and copending U.S. patent application Ser. No. 09/245,780, entitled "Electrodeposition Chemistry for Improved Filling of Apertures," filed on Feb. 5, 1999, now abandoned, which is incorporated herein by reference in its entirety.

With Plating Bath A, carbon incorporation is favored by using a relatively high current density for copper electroplating. Electrical pulses of both positive and negative polarities are used during copper electroplating. Positive electrical pulses correspond to deposition pulses, during which copper ions in the electrolyte are accelerated towards the cathode 306, resulting in the plating of copper on the substrate 330. Negative pulses correspond to dissolution pulses, during which the copper that has been plated on the substrate 430 is dissolved by being converted into copper ions in the electrolyte. These dissolution pulses help prevent void formation by dissolving excessive copper deposition around the top of an opening during electroplating.

The concentration gradients of copper ions, additives, such as suppressors, and accelerators are affected by the sequencing and durations of these deposition and dissolution pulses. For example, to achieve a void-free metal deposition inside a high aspect ratio opening 406 of FIG. 4, it is desirable that electroplating be suppressed towards the top of the opening, while being accelerated towards the bottom or inside the opening. By using different combinations of electrical pulses of opposite polarities, plating of copper can be achieved with varying profiles. Furthermore, "off-time" intervals, which correspond to periods of zero electrical pulses, may be provided to allow for re-distribution of certain chemical species in the electroplating bath as a way of controlling the deposition profile. Details of electroplating using these modulated waveforms have been disclosed in commonly assigned U.S. patent application Ser. No. 09/602,644 entitled "Method for Electrochemical Deposition of Metal Using Modulated Waveforms", filed Jun. 22, 2000, now abandoned which is incorporated herein by reference in its entirety.

A relatively high current pulse, e.g., at a current density of at least about 30 milliamperes per centimeter-square (mA/$cm^2$), preferably at least about 40 mA/$cm^2$, maybe used during an initial deposition stage, which may last a few hundred milliseconds to a few seconds. Alternatively, it is also possible to use multiple pulses during the initial deposition stage. For example, these multiple pulses may include multiple deposition pulses at relatively high current, or they may include both deposition and dissolution pulses, or different combinations thereof.

Following this initial deposition stage, the remaining copper deposition is performed using multiple deposition and dissolution pulses. The deposition and dissolution pulses maybe repeated as many times as necessary, and in different combinations of time duration and current density, to achieve void-free deposition.

During a second deposition stage, metal deposition maybe performed at a reduced current density compared to the initial stage. For example, a current density of less than about 10 mA/$cm^2$, preferably about 5 mA/$cm^2$, is used for the deposition pulses, while a current density of between about −5 mA/$cm^2$ and about −40 mA/$cm^2$, preferably about −25 mA/$cm^2$, is used for the dissolution pulses. The time duration for the deposition and dissolution pulses may vary between a few milliseconds and about 800 milliseconds. With the second deposition stage having a total time duration between about 20 and about 60 seconds, a copper layer of about 1000 Å may be formed inside the opening 406. It is understood that such a plating pulse sequence is meant to be illustrative, and other variations of pulse waveforms may also be used to achieve desired plating profiles.

Figure 5A:
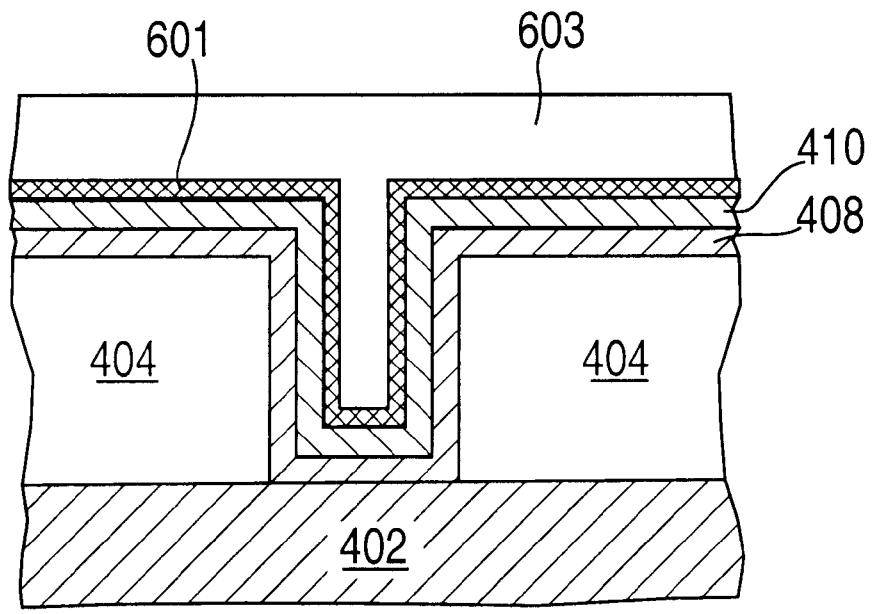
FIGS. 5a–b are schematic sectional views of copper layers formed according to embodiments of the invention.

FIG. 5a illustrates a sectional view of the result of such a deposition sequence, in which a first copper layer 601 with an effective carbon content for electromigration improvement is formed during the initial deposition stage. In one example, the first copper layer 601 may have a thickness between about 100 Å to about 200 Å and a carbon content less than about $5 \times 10^{19}$ atoms/$cm^3$, preferably between about $1 \times 10^{19}$ atoms/$cm^3$ and about $3 \times 10^{19}$ atoms/$cm^3$. Thus, the first copper layer 601 has a higher carbon content compared to those obtained from conventional copper plating processes, which is less than about $5 \times 10^{18}$ atoms/$cm^3$.

A second copper layer 603 is then formed on the first copper layer 601 during the low current deposition stage comprising the multiple cycles of deposition and dissolution pulses. Depending on the specific applications, the second copper layer 603 maybe deposited to any desired thickness, e.g., at least about 1000 Å, or sufficiently thick to fill the opening 406. There is no appreciable carbon incorporation in the second copper layer 603. The first and the second copper layers 601 and 603 maybe collectively referred to as the doped copper layer 412 shown previously in FIG. 4c.

EXAMPLE 2

As previously mentioned, the plating pulse sequence used for carbon incorporation varies with the specific plating bath that is used. For example, a conventional electroplating bath maybe used. One example of a conventional electroplating bath is known as a Cu Bath M™, which is available from Enthone-OMI of New Haven, Conn. The Cu Bath M™ contains proprietary compounds, but typically has a pH that is about 10 times more acidic than the Plating Bath A. For example, the pH for the conventional electroplating bath maybe less than about 0.1. The inventors have found that, unlike Plating Bath A carbon incorporation using this plating bath is enhanced by using a relatively low current density for the deposition pulses. It is believed that this different dependence on the current density may be attributed to the different compounds and/or the pH used in the plating baths.

A low current DC pulse, e.g., at a current density of less than about 5 mA/cm$^2$, preferably less than about 3 mA/cm$^2$, may be used during an initial deposition stage. This results in the formation of a first copper layer having a carbon content between about $1 \times 10^{19}$ atoms/cm$^3$ and about $5 \times 10^{19}$ atoms/cm$^3$, similar to layer 601 of FIG. 5a. Again, the carbon content of this first copper layer is higher than that typically obtained using a conventional plating process, which is less than about $5 \times 10^{18}$ atoms/cm$^3$. A higher current DC pulse, e.g., greater than about 10 mA/cm$^2$, may then be used for subsequent copper deposition, resulting in the formation of a second copper layer similar to layer 603 of FIG. 5a.

Note that the specific plating waveform parameters such as current density, pulse polarities and time durations used for electroplating depend on the electroplating baths employed. In general, either DC plating or pulses of both positive and negative polarities maybe used as appropriate with different electroplating baths to form a doped copper layer according to the teachings of the invention.

Using deposition pulse sequences, along with the respective electroplating baths, a doped copper layer 412 can be formed with the "carbon-rich" layer 601 adjacent to the metal seed layer 410, and thus, closer to the underlying barrier layer 408. The term "carbon-rich" is used to generally denote the portion of the doped copper layer 412 that has a higher carbon content compared to other portions of the doped copper layer 412. The location of this carbon-rich layer 601 provides an effective way of ensuring reliable contact to the barrier layer 408 by minimizing copper electromigration.

EXAMPLE 3

In practicing embodiments of the invention, the deposition time durations and current density of the electrical pulses may be adjusted as appropriate to achieve desired plating results, including the total carbon content and the location of the carbon-rich layer. As such, the plating pulse sequence may also be designed to deposit several carbon-rich copper layers having varying carbon contents, or one carbon-rich copper layer at other locations within the doped copper layer 412.

Figure 5B:
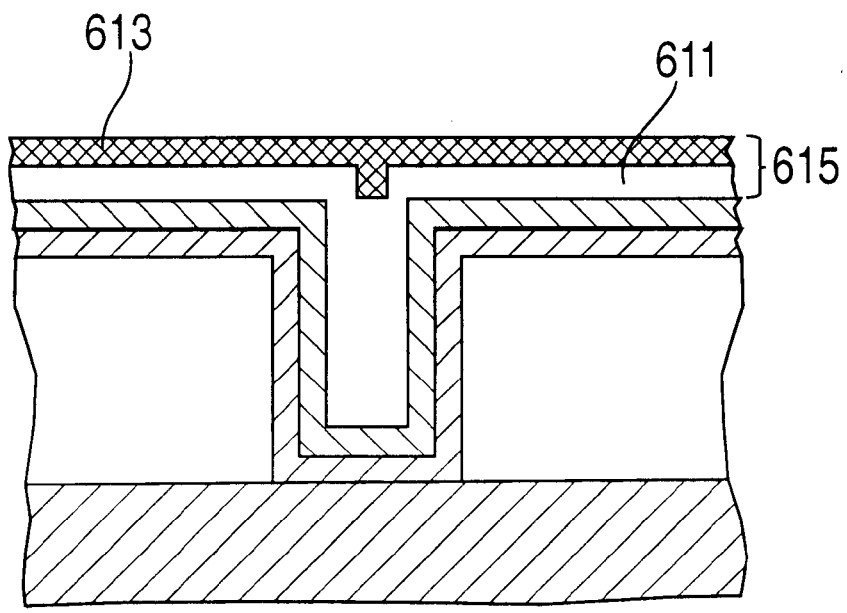

One example is shown in FIG. 5b, in which a first copper layer 611 is deposited under conditions such that there is no appreciable carbon incorporation. A second copper layer 613 is then deposited on the first copper layer 611 under conditions that promote carbon incorporation. This may be achieved, for example, by using relatively high current density deposition pulses in Plating Bath A, or relatively low current density deposition pulses in conventional plating baths, as previously illustrated in Example 1 and Example 2. It is also understood that different combinations of multiple pulses, including deposition and dissolution pulses, maybe used for depositing the second copper layer 613.

After copper electroplating, the carbon-doped copper layer 615 (comprising both first and second layers 611 and 613) is subjected to a thermal anneal, for example, in an annealing chamber such as that of chamber 202 in the iECP system of FIG. 2. During thermal annealing, carbon atoms diffuse to other portions of the doped copper layer 615. The degree of carbon incorporation and distribution within the doped copper layer 615 are affected by several factors. For example, the amount of carbon content can be controlled by the deposition pulse current density and duration, while the extent of carbon diffusion within the doped copper layer 615 can be controlled by annealing conditions such as anneal time and temperature. In general, a longer anneal time results in carbon diffusion into a greater depth of the doped copper layer 615, and a higher annealing temperature allows a higher diffusion rate.

The annealing conditions are often selected based on various factors such as process throughput, thermal constraints arising from material compatibility or specific processing needs. For example, if the carbon-doped layer 615 is subjected to a subsequent planarization step such as chemical mechanical polishing (CMP), annealing should be performed to ensure sufficient carbon content in the copper layer that remains after CMP. Using an annealing temperature between about 100° C. and about 400° C., an annealing time of about one minute is found to be adequate for many applications. Longer annealing times may also be used as desired.

EXAMPLE 4

In the previous examples, a doped copper layer is formed in which the carbon content is preferably controlled within a certain range, and the location of the carbon-rich layer within the doped copper layer is controlled by a suitable plating pulse sequence. These embodiments are specially applicable to situations in which too high of a carbon content may result in the onset of other failure mechanisms, and thus, cause a decrease in a mean time between failures (MTBF) of the copper interconnect.

In other applications, it may be desirable to form a doped copper layer such that there is a uniform distribution of the non-metallic dopant throughout the doped copper layer. This can be achieved, for example, by using multiple deposition and dissolution pulses. In such a case, the deposition pulses are applied at a relatively high current density, e.g., at least about 40 mA/cm$^2$, for the entire duration of copper electroplating using Plating Bath A. Dissolution pulses are used to avoid void formation by dissolving excessive copper deposition around the top of an opening during electroplating, while off-time intervals maybe used for profile control. Such an embodiment may be applicable, for example, to situations in which the mean time between failures of the copper interconnect is found to increase monotonically with the non-metallic dopant content.

EXAMPLE 5

Figure 6:
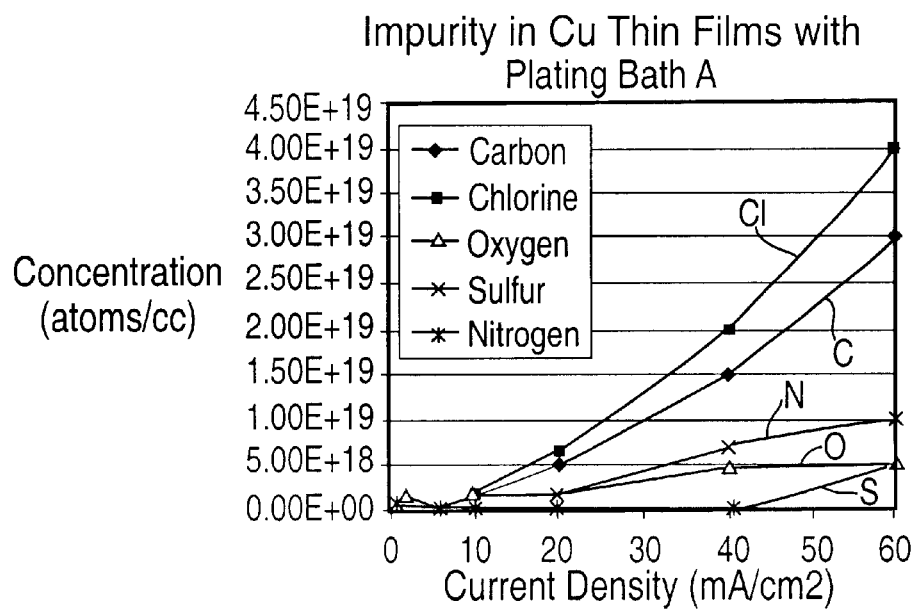
FIG. 6 is a plot of the carbon concentration in copper layers as a function of deposition current density in one electroplating bath.

The effect of current density on carbon incorporation in an electroplated copper layer is further illustrated in FIG. 6, which shows a plot of carbon concentration in different samples of copper layers as a function of deposition current density. The samples of copper layers, each having a thickness of about 0.8 μm, are electroplated on silicon wafer substrates using the Plating Bath A previously described in Example 1. Prior to electroplating, a metal seed layer comprising a tantalum layer with a thickness of about 250 Å and a copper layer with a thickness of about 2000 Å is formed on each of the silicon wafer substrates. The samples of copper layers used in this example are deposited at different current densities, e.g., ranging from about 2 mA/cm$^2$ to about 60 mA/cm$^2$. The carbon concentration in each of the deposited copper layers is then measured using secondary ion mass spectrometry(SIMS). As shown in FIG.

6, the carbon content in the electroplated copper layer increases with increasing current density. For example, at a current density of about 30 mA/cm², the deposited copper layer has a carbon content of about $1 \times 10^9$ atoms/cm³.

FIG. 6 also shows the concentrations of other non-metals such as chlorine, oxygen, nitrogen and sulfur present in the copper layers. For example, chlorine concentration is found to increase with increasing current density. Although chlorine incorporation may help increase electromigration resistance of the doped copper layer, the chlorine concentration should not be so high as to cause undesirable results such as corrosion. Thus, in general, the chlorine concentration is preferably controlled to below about $3 \times 10^{19}$ atoms/cm³. In the current density regime of FIG. 6, other non-metals such as sulfur, oxygen and nitrogen remain at relatively low concentrations, and are not expected to cause any undesirable effects on the deposited copper layers. In general, it is also desirable to keep the concentrations of these other non-metals below about $3 \times 10^{19}$ atoms/cm³.

EXAMPLE 6

Figure 7:
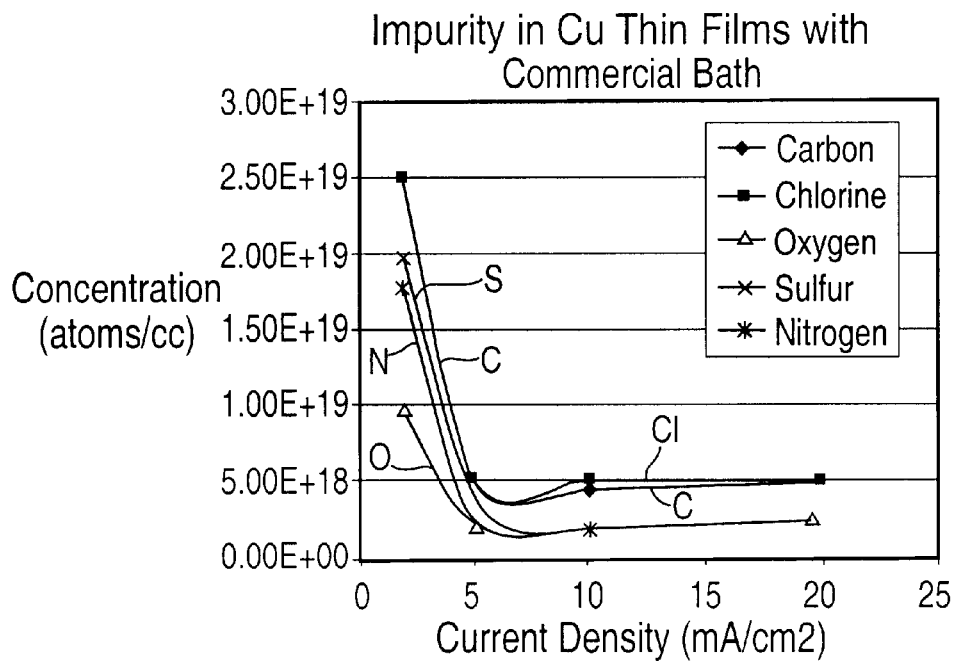
FIG. 7 is a plot of the carbon concentration in copper layers as a function of deposition current density in another electroplating bath.

FIG. 7 is another illustration of the effect of deposition current density on the carbon content of electroplated copper layers. The substrates and metal seed layers used in this example are similar to those previously described in Example 5. However, unlike Example 5, the copper layers are deposited using a plating bath such as Cu Bath M™ from Enthone-OMI. FIG. 7 shows that at a deposition current density greater than about 10 mA/cm² the carbon content remains relatively constant, e.g., at about $5 \times 10^{18}$ atoms/cm³. However, at current densities below about 5 mA/cm² the carbon content increases with decreasing current density. Thus, at a current density below about 3 mA/cm² the copper layer has a carbon content greater than about $1 \times 10$ atoms/cm³.

It is noted that the behavior of chlorine incorporation is similar to that of carbon incorporation. As such, it is desirable that an appropriate current density be used such that the chlorine incorporation maybe controlled to avoid potential corrosion problems. Although the other nonmetal concentrations such as sulfur, oxygen and nitrogen also increase with decreasing current density below about 5 mA/cm², their concentrations remain sufficiently low such that no undesirable processing issue is anticipated.

As shown in FIGS. 6 and 7, the behavior of the carbon content as a function of deposition current density is very different for the two electroplating baths (Plating Bath A and Cu Bath M). It is believed that this vastly different behavior is a result of the different compounds as well as the pH used in these two plating baths.

In other embodiments, carbon incorporation may further be controlled by varying respectively the pH or the chloride concentration in the electroplating bath, in conjunction with appropriate electroplating currents. Since adsorption of additives tend to decrease with increasing pH, and the activation of additives is dependent on chloride ion concentration, the degree of carbon incorporation in the doped copper layer maybe controlled accordingly by varying these process parameters.

Although several preferred embodiments which incorporate the teachings of the present invention have been shown and described in detail, those skilled in the art can readily devise many other varied embodiments that still incorporate these teachings. For example, other suitable copper-containing electrolytes such as copper fluoroborate, copper gluconate, copper sulfamate, copper pyrophosphate, copper chloride, copper cyanide, or mixtures thereof, may be used to supply copper for electroplating, and other suitable compounds maybe used as the source for the non-metallic dopant. It is further understood that other conditions such as pH or temperature may also be used for the electroplating baths. Depending on the plating bath conditions, a variety of plating pulse sequences may be employed for forming a doped copper layer with improved electromigration characteristics compared to pure copper layer.

What is claimed is:

1. A method of film processing, comprising:
   positioning a substrate in an electroplating bath;
   forming a doped copper layer on the substrate; by applying an electroplating current at a first current density of at least about 30 mA/cm² to an electrode in the electroplating bath, wherein the doped copper layer comprises an amount of non-metal that is controlled for increasing electromigration resistance in the doped copper layer compared to a pure copper layer; and
   forming a layer consisting essentially of copper on the doped copper layer by applying electroplating current at a second current density of less than about 10 mA/cm² to the electrode in the electroplating bath.

2. The method of claim 1, wherein the non-metal is selected from a group consisting of carbon and chlorine.

3. The method of claim 1, wherein the non-metal is carbon and the amount of carbon is between about $1 \times 10^{19}$ atoms/cm³ and about $5 \times 10^{19}$ atoms/cm³.

4. The method of claim 3, wherein the electroplating bath comprises a carbon source and the doped copper layer is doped by incorporating carbon from the carbon source during the electroplating at a first current density of at least about 30 mA/cm².

5. The method of claim 4, wherein the carbon source is an organic-based suppressor, and the electroplating bath further comprises a copper-containing electrolyte and an accelerator.

6. The method of claim 5, wherein the electroplating bath has a pH of between about 0.6 and about 3.

7. The method of claim 6, wherein the electroplating bath further comprises a source of chloride ions at a concentration between about 50 ppm and about 400 ppm.

8. The method of claim 6, wherein the copper-containing electrolyte is copper sulfate at a concentration between about 0.1 M and about 0.9 M.

9. The method of claim 6, wherein the organic-based suppressor has a concentration between about 5 ppm and about 400 ppm in the electroplating bath.

10. The method of claim 9, wherein the organic-based suppressor is a glycol compound.

11. The method of claim 1, wherein the first current density is at least about 40 mA/cm².

12. The method of claim 1, further comprising annealing the doped copper layer at an elevated temperature of at least about 100° C.

13. A method of forming copper, comprising:
    positioning a substrate in an electroplating bath having a pH of between about 0.6 and about 3 and comprising a copper-containing electrolyte and a carbon-containing source;
    forming a doped copper layer on the substrate by applying an electroplating current at a first current density of at least about 30 mA/cm² to an electrode in the electroplating bath and incorporating an amount of carbon that is controlled for increasing electromigration resistance of the doped copper layer compared to a pure copper layer; and forming a copper layer on the doped copper layer by applying electroplating current at a second current density of less than about 10 mA/cm$^2$ to an electrode in the electroplating bath.

14. The method of claim 13, wherein the amount of carbon in the doped copper layer is controlled by varying the first electroplating current density.

15. The method of claim 14, wherein the amount of carbon in the doped copper layer is further controlled by varying a pH of the electroplating bath.

16. The method of claim 15, wherein the amount of carbon in the doped copper layer is further controlled by varying an amount of chloride ions present in the electroplating bath.

17. The method of claim 16, wherein the copper-containing electrolyte is selected from the group consisting of copper sulfate, copper fluoroborate, copper gluconate, copper sulfamate, copper pyrophosphate, copper chloride, copper cyanide, or mixtures thereof.

18. The method of claim 16, wherein the carbon-containing source is an organic-based suppressor.

19. The method of claim 18, wherein the organic-based suppressor is polyethylene glycol.

20. A method of forming a copper interconnect, comprising:

positioning a substrate in an electroplating bath having a pH of between about 0.6 and about 3 and comprising a copper-containing electrolyte and an ethylene oxide propylene oxide compound, the substrate comprising an insulating layer having an opening extending to a conductive layer underlying the insulating layer;

applying one or more pulses of a first electroplating current to an electrode in the electroplating bath at a first current density of at least about 30 mA/cm$^2$ for forming a first copper layer inside the opening to contact the conductive layer on the substrate, wherein the first copper layer comprises an amount of carbon that is controlled for increasing electromigration resistance of the first copper layer compared to pure copper; and applying one or more pulses of a second electroplating current to the electrode in the electroplating bath at a second current density of less than about 10 mA/cm$^2$ for depositing a second copper layer on the first copper layer.

21. The method of claim 20, further comprises applying one or more pulses of a third electroplating current to the electrode in the electroplating bath.

22. The method of claim 21, wherein the copper-containing electrolyte is copper sulfate.

23. The method of claim 21, wherein the pulses of the second electroplating current and the pulses of the third electroplating current have opposite polarities.

24. The method of claim 23, wherein the third electroplating current has a current density between about −5 mA/cm$^2$ about −40 mA/cm$^2$.

25. The method of claim 24, wherein the first electroplating current has a current density of at least about 40 mA/cm$^2$.

26. A method of forming a copper interconnect, comprising:

positioning a substrate in an electroplating bath having a pH of less than about 0.1;

forming the copper interconnect on the substrate by forming a doped copper layer on the substrate by applying an electroplating current at a first current density of less than about 5 mA/cm$^2$ an electrode in the electroplating bath and, wherein the doped copper layer comprises a non-metal having a concentration that is controlled for increasing a mean time between failure of the copper interconnect; and forming a copper layer on the doped copper layer by applying electroplating current at a second current density of greater than about 10 mA/cm$^2$ to an electrode in the electroplating bath.

27. The method of claim 26, wherein the non-metal is carbon.

28. The method of claim 27, wherein the concentration of the carbon varies within the doped copper layer.

29. The method of claim 28, wherein the concentration of the carbon is between about $1\times10^{19}$ atoms/cm$^3$ and about $5\times10^{19}$ atoms/cm$^3$.

30. The method of claim 1, further comprising depositing a copper seed layer on the substrate before forming a doped copper layer on the substrate.

31. The method of claim 30, wherein the copper seed layer is deposited by PVD, CVD, or electroless plating.

32. The method of claim 13, further comprising depositing a copper seed layer on the substrate before forming a doped copper layer on the substrate.

33. The method of claim 32, wherein the copper seed layer is deposited by PVD, CVD, or electroless plating.

34. The method of claim 13, further comprising annealing the doped copper layer.

35. The method of claim 20, wherein the electroplating bath includes between about 5 ppm and about 400 ppm of the ethylene oxide propylene oxide compound.

* * * * *

UNITED STATES PATENT AND TRADEMARK OFFICE
CERTIFICATE OF CORRECTION

PATENT NO. : 6,740,221 B2
DATED : May 25, 2004
INVENTOR(S) : Robin Cheung and Liang-Yuh Chen It is certified that error appears in the above-identified patent and that said Letters Patent is hereby corrected as shown below:

Title page,
Item [56], References Cited, FOREIGN PATENT DOCUMENTS, replace "JP 1050902" with -- EP 1050902 --;

Column 2,
Line 45, replace "maybe" with -- may be --;

Column 3,
Lines 45 and 59, replace "maybe" with -- may be --;

Column 4,
Lines 10, 27, 41 and 42, replace "maybe" with -- may be --;

Column 6,
Lines 6, 17, 20 and 51, replace "maybe" with -- may be --;

Column 7,
Lines 1 and 60, replace "maybe" with -- may be --;

Column 9,
Line 31, insert -- , -- after "5 mA/cm$^2$ --;
Line 34, replace "1x10" with -- 1x10$^{19}$ --;
Lines 39 and 59, replace "maybe" with -- may be --;

Column 10,
Line 3, replace "maybe" with -- may be --; and

UNITED STATES PATENT AND TRADEMARK OFFICE
CERTIFICATE OF CORRECTION

PATENT NO. : 6,740,221 B2
DATED : May 25, 2004
INVENTOR(S) : Robin Cheung and Liang-Yuh Chen It is certified that error appears in the above-identified patent and that said Letters Patent is hereby corrected as shown below:

Column 12,
Line 18, after "5 mA/cm$^2$", insert -- to --.

Signed and Sealed this

Twenty-sixth Day of October, 2004

JON W. DUDAS
*Director of the United States Patent and Trademark Office*